United States Patent
Lin et al.

(10) Patent No.: US 6,665,160 B2
(45) Date of Patent: Dec. 16, 2003

(54) VOLTAGE CONTROL COMPONENT FOR ESD PROTECTION AND ITS RELEVANT CIRCUITRY

(75) Inventors: Geeng-Lih Lin, Hsinchu Hsien (TW); Ming-Dou Ker, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 300 days.

(21) Appl. No.: 09/852,684

(22) Filed: May 11, 2001

(65) Prior Publication Data

US 2002/0105766 A1 Aug. 8, 2002

(30) Foreign Application Priority Data

Feb. 5, 2001 (TW) ........................................ 90102319 A

(51) Int. Cl.[7] .................................................. H02H 9/00
(52) U.S. Cl. ........................ 361/56; 361/91.1; 361/111
(58) Field of Search ........................... 361/56, 91.1, 111

(56) References Cited

U.S. PATENT DOCUMENTS

| | | | | |
|---|---|---|---|---|
| 4,385,337 A | * | 5/1983 | Asano et al. | ............... 361/91.5 |
| 5,886,862 A | * | 3/1999 | Anderson et al. | ............. 361/56 |
| 6,369,998 B1 | * | 4/2002 | Anderson | ................... 361/111 |

* cited by examiner

Primary Examiner—Gregory J. Toatley, Jr.
Assistant Examiner—James Demakis
(74) Attorney, Agent, or Firm—Intellectual Property Solutions, Incorporated

(57) ABSTRACT

The present invention proposes an ESD protection circuit and its related circuits, suitable in an integrated circuit (IC), and coupled between a first pad and a second pad. When a power supply is provided to the IC, a bias generator generates a bias voltage to close the protection component. When the power supply is not provided to the IC, the protection component is always on to release the ESD stress between the first pad and the second pad.

24 Claims, 7 Drawing Sheets

VOLTAGE CONTROL COMPONENT FOR ESD PROTECTION AND ITS RELEVANT CIRCUITRY

BACKGROUND OF THE INVENTION

1. Field of the Invention

The present invention relates to an electrostatic discharge (ESD) protection component, the relevant ESD Protection circuitry, and the ESD protection system.

2. Description of the Related Art

As the semiconductor manufacturing process develops, ESD protection has become one of the most critical reliability issues for integrated circuits (IC). In particular, as semiconductor process advances into the deep sub-micron stage, scaled-down devices, thinner gate oxides, lightly-doped drain regions (LDD), shallow trench isolation (STI) process and the metallic salicide process are more vulnerable in terms of ESD stress. Therefore, an efficient ESD protection circuit must be designed and placed on the I/O pad to clamp the overstress voltage across the gate oxide in the internal circuit.

FIG. 1A shows a conventional ESD protection circuit where an N-type metal oxide semiconductor transistor (NMOS) NE is used as the primary ESD protection component and the gate of NE is connected to the source. FIG. 1B is the IV curve of the NMOS transistor in FIG. 1A. Because NE is an enhanced-mode NMOS which is kept off under circuit operations, the external electronic signals can reach the internal circuit 12 via the I/O pad 10. When a positive-ESD-pulse stress relative to VSS occurs at the I/O pad 10, the drain voltage of the NE exceeds its trigger voltage $V_{trigger}$ (the breakdown voltage between the drain and the substrate of NE) which triggers the parasitic bipolar transistor (BJT) in NE. The ESD current should be released before any internal destruction caused by the ESD stress.

However, during the normal CMOS process, the breakdown voltage between the drain and source of the NMOS always climbs higher than 10v, possibly damaging the oxide gate produced in the CMOS process. Therefore, it is the main object for the ESD protection circuit to reduce the trigger voltage $V_{trigger}$.

FIGS. 2A and 2D are cross-sectional diagrams of the conventional NMOS. By ion implantation, a breakdown-trigger layer 20 or 22 is formed under the N+ diffusion of the drain and the source. The breakdown-trigger layer 20 or 22 is used to facilitate the breakdown of the PN-junction between the N+ diffusion 16 and the P-substrate 18 by lowering the breakdown voltage between the drain and substrate in the NMOS. Consequently, the timing for turning on the parasitic BJT in the NMOS is sped up to prevent damage to the internal circuits from the ESD stress.

Alternatively, SCR is adapted as the primary ESD protection component in the conventional ESD protection circuit. The SCR is off in the normal circuit operation state, but triggered to release the SD current during ESD stress. It is thus necessary to search for a suitable means of reducing the trigger voltage Vt when using SCR as the ESD protection component.

The object of the present invention is to lower the trigger voltage of ESD protection component.

Another object of the present invention is to provide an effective ESD protection to the connection pads in the IC.

SUMMARY OF THE INVENTION

An object of the present invention is to provide an electrostatic discharge (ESD) protection components applied on an integrated circuit (IC), and coup ed between a first and second connection pad. When a power supply is provided to the IC, the protection component is turned off, and when no power supply is provided, the protection component remains on to release ESD stress between the first connection pad and the second connection pad.

Another object of the present invention is to provide an LSD protection circuit for an IC, coupled to a first pad and a second pad. The ESD protection circuit comprises an ESD protection component and a bias generator. The ESD protection component is connected between the first pad and the second pad. The bias generator is used to turn off the ESD protection component when a power supply is provide to the IC. Conversely, when no power supply is provided to the IC, the ESD protection component is always on to release ESD stress between the first pad and the second pad.

The present invention further provides an ESD protection system for an IC. The IC comprises a plurality or connection pads, Pad1 . . . PadN. The protection system comprises: an ESD bus line, a plurality of ESD protection component D1 . . . DN and a bias generator. Each ESD protection Dn is connected between a correspondent Padn and the ESD bus line. The bias generator is used for providing a predetermined voltage to close D1 . . . DN when a power supply is provided. D1 . . . Dn is always on when no power supply is provided to release ESD stress between a Padx and a Pady.

The ESD protection component of the present invention can be either p-type or N-type depletion-mode metal oxide semiconductor transistor (MOS), The advantage of the present invention is that through the ESD protection component of the present invention, the ESD current is easily dissipated. When there is no power supply provided to the IC, the ESD protection component is always on. Therefore, ESD stress is easily released through the ESD protection component of the present invention when no power supply is provided.

BRIEF DESCRIPTION OF THE DRAWINGS

The present invention can be more fully understood by reading the subsequent derailed description in conjunction with the examples and references made to the accompanying drawings, wherein.

DETAILED DESCRIPTION OF THE PREFERRED EMBODIMENT

Figure 1A:
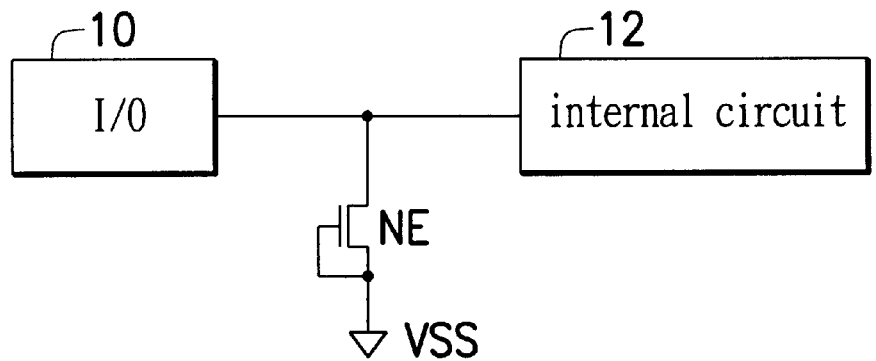
FIG. 1A shows a conventional ESD protection circuit.
Figure 1B:
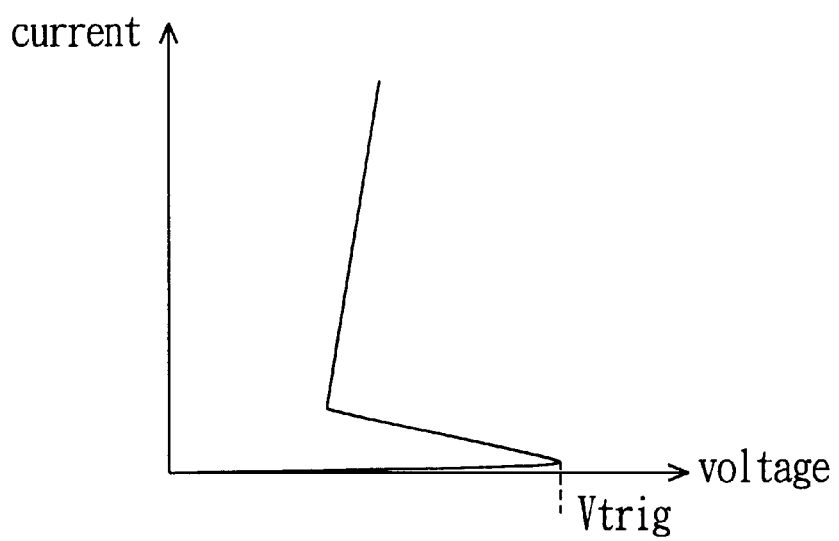
FIG. 1B shows the I–V curve of the ESD protection device in FIG. 1A.
Figure 2A:
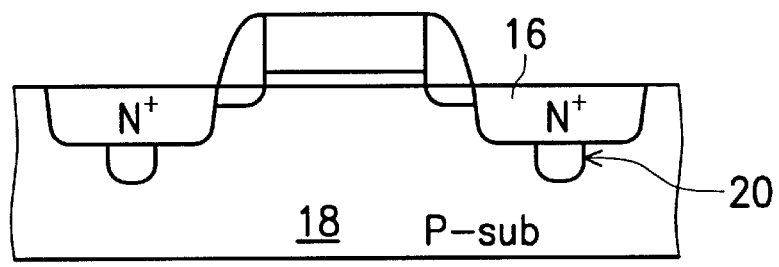
FIGS. 2A and 2B are cross-sectional diagrams of a conventional NMOS with additional breakdown-trigger layer.
Figure 2B:
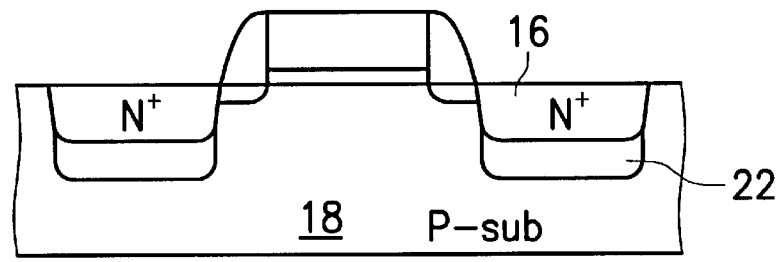
Figure 3:
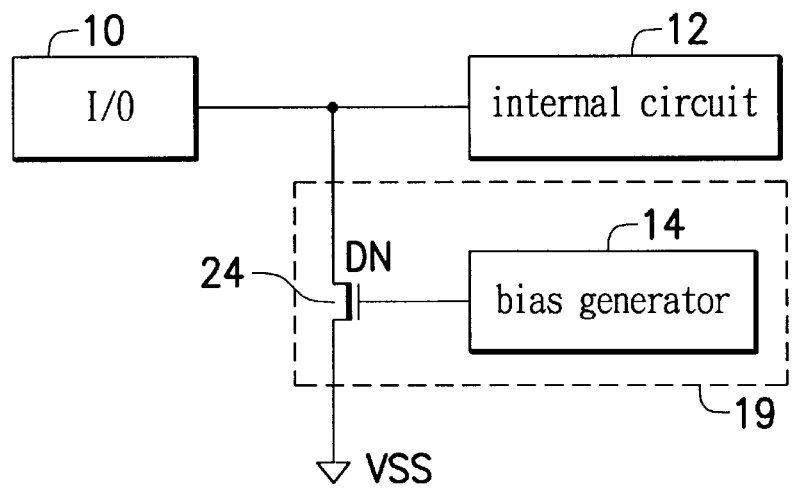
FIG. 3 depicts an ESD protection circuit of the present invention.

FIG. 3 depicts an ESD protection circuit of the present invention. The ESD protection circuit 19 integrated into an IC comprises a depletion MOS, DN, 24 as the main ESD projection component, and a bias generator 14. The drain and source to DN 24 are respectively coupled to the I/O pad 10 and the VSS, whereas, the gate electrode of DN 24 is controlled by the bias generator 14.

When a power supply is provided to the IC, bias generator 14 generates a voltaqe lower than VSS to close DN 24. The electric signal on the I/O pad 10 can be transmitted to the Internal circuit 12 to proceed normal operation.

When no power supply is provided to the IC, the sate to source bias voltage $V_{gs}$ of DN 24 is 0V. Because the threshold voltage of the depletion NMOS is lower than 0V, DN 24 is always on or in a conductive state. In other words, an equivalent low resistance exits between the I/O pad 10 and VSS when no power supply is provided. Therefore, any stress between the I/O pad 10 and VSS can thereby be released through the equivalent low resistor that protects the internal circuit 12 from ESD event.

ND 24 can be either a surface channel MOS or a buried channel MOS. For ESD protection, the buried channel MOS is a better option or its voluminous current-conducting path which dispatches heat generated by ESD stress more effectively.

Figure 4A:
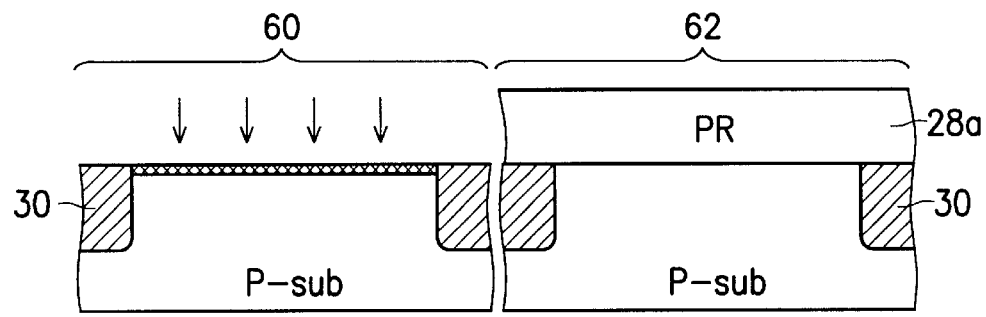
FIGS. 4A–4C depicts a conceptual NMOS diagram with a buried channel NMOS and an enhanced NMOS as the ESD protect ion component.
Figure 4B:
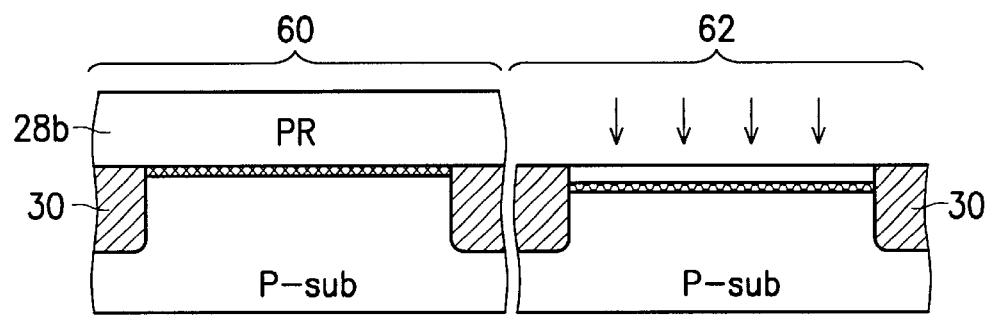
Figure 4C:
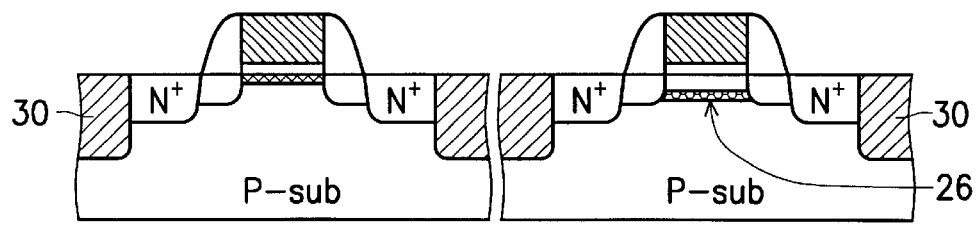

FIGS. 4A~4C depict fabrication for a surface-channel NMOS and a buried-channel NMOS The left part of the diagram is the surface-channel NMOS 60 and the right is buried-channel NMOS 62. In the conventional CMOS process, the NMOS threshold voltage Vt must be adjusted to an optimum value. FIG. 4a shows an example of the ion implantation on the surface-channel NMOS 60 while the buried-channel NMOS 62 is shielded by a photoresistance layer 28a for $V_t$ implantation. FIG. 4b shows another example of the ion implantation on the buried-channel NMOS 62 with the surface-channel channel NMOS 60 shielded by a photoresistance layer 28b generated by adding an extra ESD implantation process followed by relevant lithography processes. Gate structures and the drain/source LDD structure are later formed on the P-substrate so that the surface-channel NMOS 60 and the buried-channel NMOS 62 are completed as shown in FIG. 4c. The NMOS threshold voltage for ESD protection and the NMOS channel depth can be adjusted by the implantation energy of the ESD ion implantation process and the doped concentration. As known in the art, when the threshold voltage of an NMOS is lower than 0V, the NMOS is referred to as a depletion-mode NMOS. When the threshold voltage of an NMOS is higher than 0V, the NMOS is referred to as an enhanced-mode NMOS.

By controlling the ESD ion implantation process properly, the depletion NMOS and the buried channel NMOS can be formed simultaneously. The conductive channel 26 of the buried-channel NMOS 62 is placed under the surface, which is thus named the buried-channel NMOS as in contrast to the surface-channel NMOS 60.

Figure 5A:
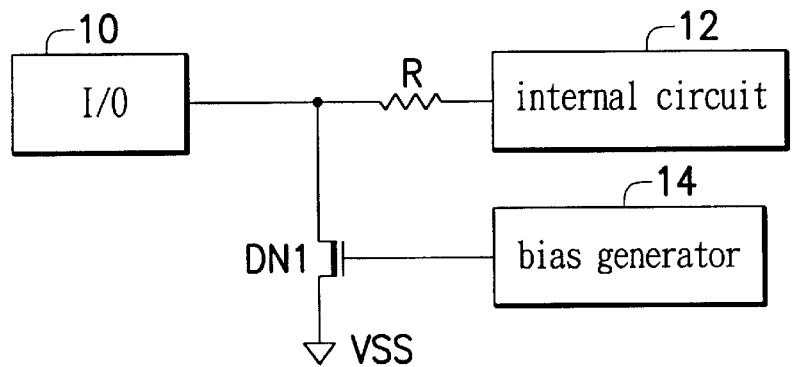
FIGS. 5A shows the diagram of depletion NMOS of the present invention a the primary ESD protection circuit.
Figure 5B:
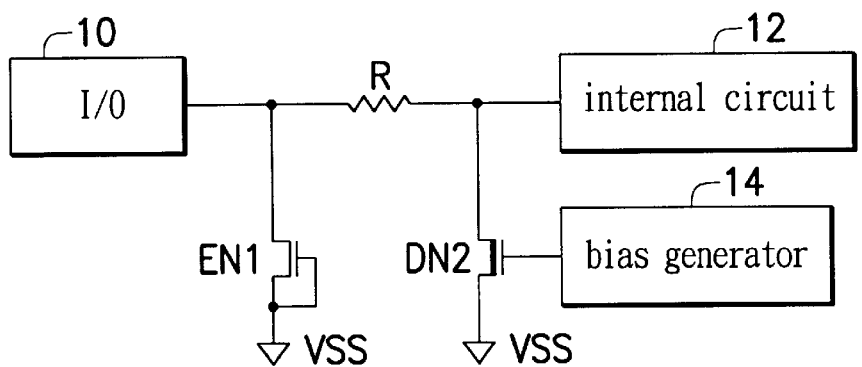
FIG. 5B shows the diagram of the depletion NMOS of the present invention as the secondary ESD protection circuit.
Figure 5C:
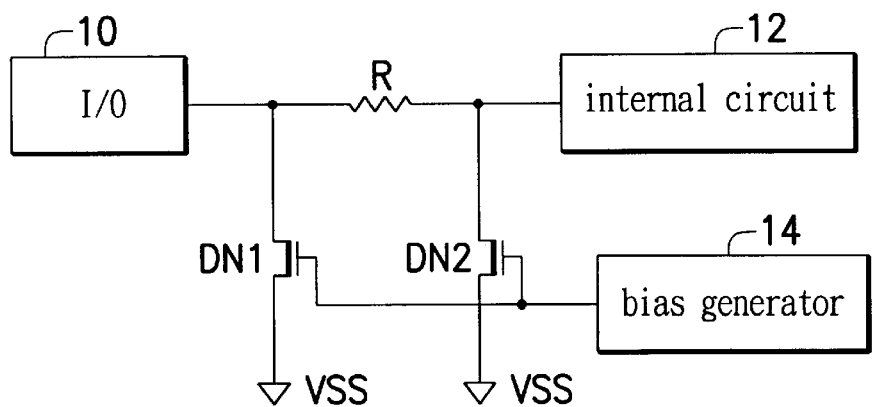
FIG. 5C shows the application of the present invention on both the primary and the secondary ESD protection circuits.

The depletion NMOS can be used as a primary ESD protection circuit or a secondary ESD protection circuit as shown in FIGS. 5A~5C.

FIG. 5A shows the diagram of depletion NMOS of the present invention as the primary ESD protection circuit. The primary ESD protection circuit is coupled to a connection pad directly, as shown in FIG. 5A, and the drain DN1 is directly coupled to the I/O pad 10 which is connected to the internal circuit 12 via a resistor R. When the IC is not charged with the power supply, DN1 is always on. ESD stress can be released by the conductive DN1 when VSS is grounded and the ESD pulse on the I/O pad 10 is either positive or negative. When the IC is provided with power supply, the bias generator 14 generates a negative voltage lower than VSS to close DN1 so that the electric signal on the I/O pad 10 can be transmitted to the inner circuit 12.

FIG. 5B shows a diagram of the depletion NMOS of the present invention as the secondary ESD protection circuit. The primary ESD protection circuit is formed by an enhanced mode NMOS EN1 with the gate coupled to the source. A resistor R is connected between the depletion NMOS DN2 of the secondary ESD protection circuit and the I/O pad 10. DN2 is used to relieve some ESD stress from EN1 and provides a better ESD protection to the internal circuit 12 with its lower conductive voltage.

The application of the present invention on both the primary and the secondary ESD protection circuits is shown in FIG. 5C, where the depletion NMOS DN1 is used as the primary protection circuit and the depletion NMOS DN2 is used as the secondary protection circuit. Both DN1 and DN2 are controlled by the bias generator 14 so that when the IC is supplied with a power source, both DN1 and DM2 are in off state.

Figure 6A:
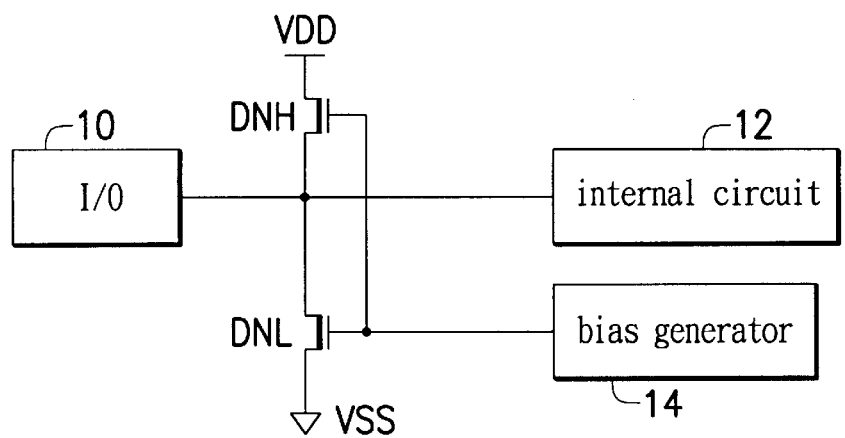
FIGS. 6A–6C show the three embodiments of the present invention applied between the I/O pad and VDD, and I/O pad and VSS.
Figure 6B:
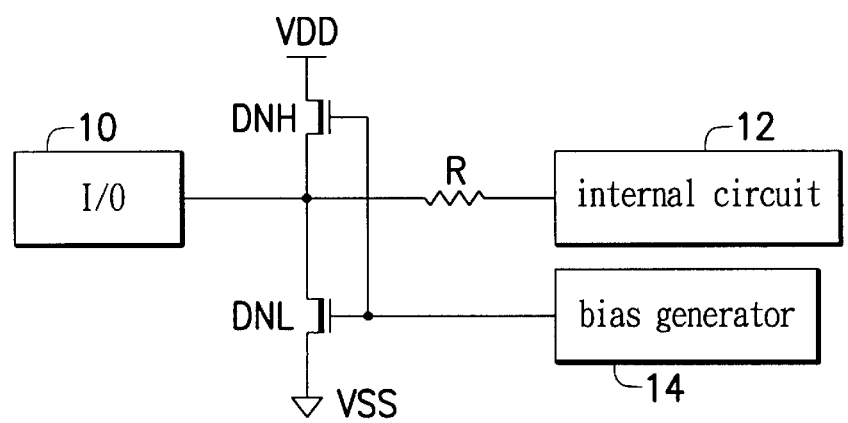
Figure 6C:
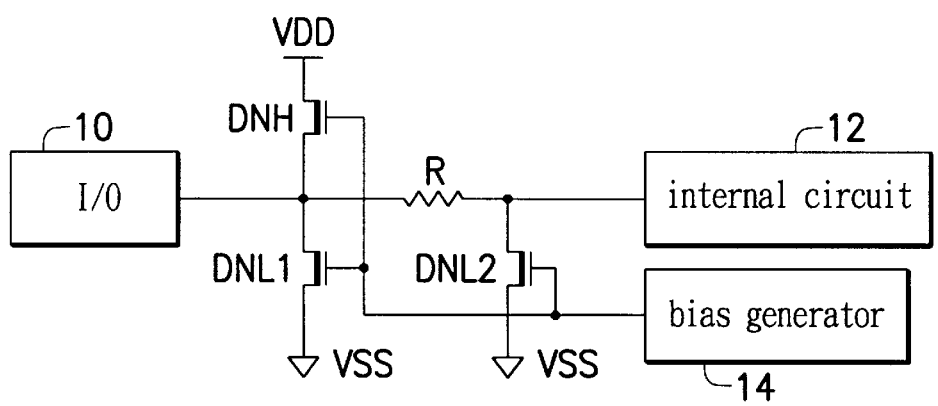

Apart from the I/O pad-to-VSS ESD protection, the present invention also provides the I/O pad-to-VDD ESD protection with similar principle. FIGS. 6A~6C show the three embodiments of the present invention applied between the I/O pad and VDD, and I/O pad and VSS. The depletion NMOS DNH is connected between VDD and I/O pad 10 and controlled by the bias generator 14. When no power supply is provided, DNH is on and releases the ESD stress between the I/O pad 10 and VDD. When a power supply is provided, DNH is switched to off state.

Figure 7:
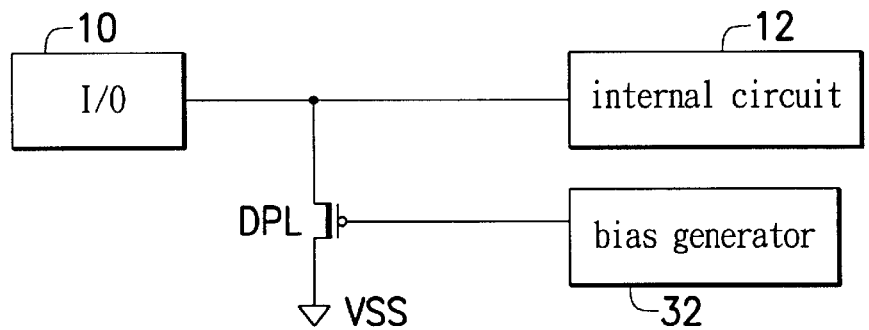
FIG. 7 shows a depletion PMOS as the ESD protection component.

Apart from the depletion NMOS, the present invention also provides a depletion PMOS as the ESD protection component as shown in FIG. 7. Similar to FIG. 3, the depletion PMOS DPL in FIG. 7 is connected between the I/O pad 10 and VSS with its gate controlled by the bias generator 32. When no power supply is provided, DPL is always conductive (or on) to release the ESD stress. But when provided with power supply, the bias generator generates a specific voltage higher than the maximum supply power (which is usually equals to VDD) to close DPL.

Similarly, the depletion NMOS in FIGS. 5 and 6 can be replaced with the depletion PMOS. The only change needs to be made as the consequence is that the voltage generated by the bias generator 14 changes from being lower than VSS to being higher than VDD when the power supply is provided.

Figure 8:
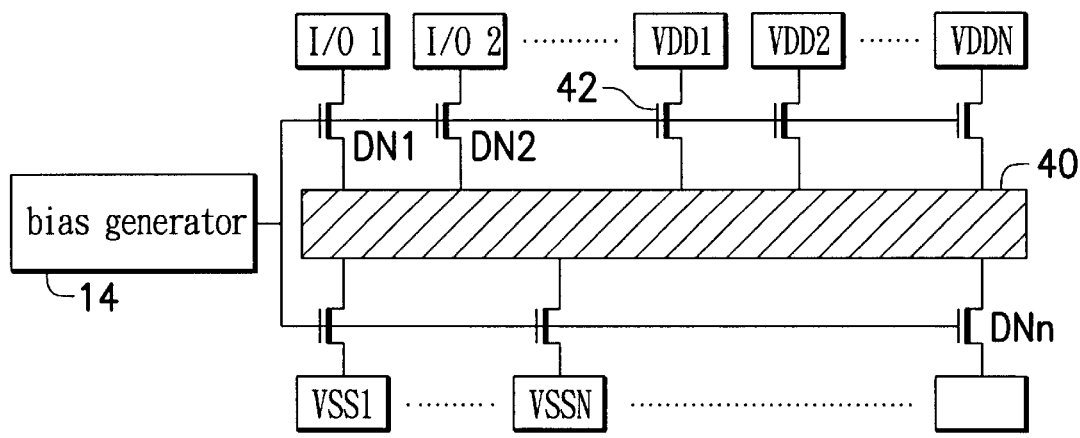
FIG. 8 is the conceptual diagram of the ESD protection system of the present invention.

FIG. 8 is the conceptual diagram of the ESD protection system of the present invention, where the IC comprises a plurality of connection pads which comprise I/O1, I/O2 . . . , VDD1, VDD2 . . . , VSS1, VSS2 . . . and so on. An ESD bus line 40 is used in the ESD protection system. A plurality of depletion NMOS DN1-DNn are respectively connected between the connection pads and the ESD bus line 40. The ESD bus line usually comprises a metal line with a large width enclosing the whole IC transistor to facilitate the connections of the ESD protection system with the pads.

When an ESD event occurs across I/O1 and I/O2, the ESD stress is released through the connected DN1, ESD bus line 40 and DN2 to achieve the ESD protection to the component of the internal circuit. When a power supply is provided, the gates of DN1-DNn are all closed through the negative voltage generated from the bias generator 14 so that each connection pad can operate normally. The depletion mode PMOS can be also used in FIG. 8 to enhance the whole-chip ESD protection.

Figure 9:
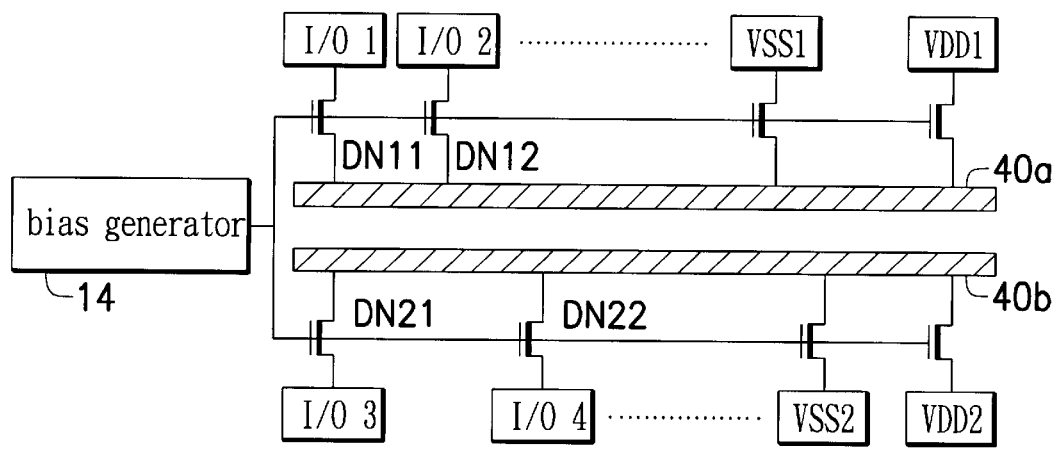
FIG. 9 is another conceptual diagram of the ESD protection system of the present invention.

FIG. 9 is another conceptual diagram of the ESD protection system of the present invention, where there are two ESD bus lines, 40a and 40b. The ESD protection system can also utilize numbers of ESD bus lines, as shown in FIG. 9. ESD bus line 40a and the depletion NMOS DN11, DN12, etc. are combined to provide ESD protection for pad I/1, I/2, VSS1, VDD1, etc. . ESD bus line 40b and the depletion NMOS DN21, DN22, etc. are combined to provide ESD protect on for pad I/O3, I/O4, VSS2, VDD2, etc. The bias generator 14 provides a negative voltage to make sure that all the depletion NMOS (DN11, DN12, . . . DN21, DN22, . . . ) are off during circuit operation. The ESD bus lines 40a and 40b may surround the chip of the IC to be convenient for building up such an ESD protection system. The number of the ESD bus lines is not limited to one or two, and is depended upon the designer's choice.

Finally, while the invention has been described by way of examples and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An electrostatic discharge (ESD) protection component, applied on an integrated circuit (IC), coupled between a first connection pad and the second connection pad;
   wherein when a power supply is provided to the IC, the protection component is turned off, and when no power supply is provided to the IC the protection component is on to release ESD stress between the first connection pad and the second connection pad, wherein the protection component is a depletion-mode metal oxide semiconductor (MOS) transistor, and the depletion-mode MOS is a buried-channel component.

2. The protection component as claimed in claim 1, wherein the protection component is controlled by a bias generator, when the power supply is provided to the IC, the bias generator generates a predetermined voltage to turn off the protection component.

3. An electrostatic discharge (ESD) protection component, applied on an integrated circuit (IC), coupled between a first connection pad and the second connection pad;
   wherein when a power supply is provided to the IC, the protection component is turned off, and when no power supply is provided to the IC the protection component is on to release ESD stress between the first connection pad and the second connection pad, wherein the protection component is a depletion-mode metal oxide semiconductor (MOS) transistor, wherein the depletion-mode MOS is a surface-channel component.

4. The ESD protection component as claimed in claim 1, wherein the depletion-mode MOS is an N-type depletion-mode MOS.

5. The ESD protection component as claimed in claim 1, wherein the depletion-mode MOS is a P-type depletion-mode MOS.

6. An electrostatic protection (ESD) protection circuit for an integrated circuit (IC), coupled to a first pad and a second pad, comprising:
   an ESD protection component, connected between the first pad and the second pad; and
   a bias generator, for turning off the ESD protection component when a power supply is provided to the IC;
   wherein the ESD protection circuit is connected to the first pad through a resistor, when no power supply is provided to the IC, the ESD protection component is always on to release ESD stress between the first pad and the second pad.

7. The ESD protection component as claimed in claim 8, wherein the ESD protection component is a depletion-mode metal oxide semiconductor (MOS) transistor.

8. The ESD protection component as claimed in claim 7, wherein the depletion-mode MOS is a buried-channel component.

9. The ESD protection component as claimed in claim 7, wherein the depletion-mode MOS is a surface-channel component.

10. The ESD protection component as claimed in claim 7, wherein the depletion-mode MOS is an N-type depletion-mode MOS.

11. The ESD protection component as claimed in claim 7, wherein the depletion-mode MOS is an N-type depletion-mode MOS.

12. The ESD protection component as claimed in claim 7, wherein the depletion-mode MOS is a P-type depletion-mode MOS.

13. The ESD protection component as claimed in claim 12, wherein the bias generator generates a predetermined positive voltage to a gate of the P-type depletion-mode MOS to close the P-type depletion-mode MOS.

14. An ESD protection system for an integrated circuit (IC), wherein the IC comprises a plurality of connection pads, Pad1 . . . PadN, the protection system comprising:
   an ESD bus line;
   a plurality of ESD protection component D1 . . . DN, each ESD protection Dn is connected between a correspondent Padn and the ESD bus line; and
   a bias generator, for providing a predetermined voltage to close D1 . . . DN when a power supply is provided;
   wherein D1 . . . Dn is on when no power supply is provided to release ESD stress between a Padx and a Pady.

15. The ESD protection system as claimed in claim 14, wherein Dn is a depletion-mode metal oxide semiconductor (MOS) transistor.

16. The ESD protection system as claimed in claim 15, wherein the depletion-mode MOS is a buried-channel component.

17. The ESD protection system as claimed in claim 15, wherein the depletion-mode MOS is a surface-channel component.

18. The ESD protection system, as claimed in claim 15, wherein the depletion-mode MOS is an N-type depletion-mode MOS.

19. The ESD protection system, as claimed in claim 15, wherein the depletion-mode MOS is a p-type depletion-mode MOS.

20. The ESD protection system as claimed in claim 14, wherein the predetermined voltage is provided to the control gates of D1 . . . DN to close D1 . . . DN.

21. The ESD protection system as claimed in claim 14, wherein the ESD bus line is a metal line.

22. The ESD protection system as claimed in claim 14, wherein Padx is a power supply pad.

23. The ESD protection system as claimed in claim 14, wherein Padx is an output pad.

24. The ESD protection system as claimed in claim 14, wherein the ESD protection system comprises a plurality of ESD bus lines surrounding a chip for the IC.

* * * * *